United States Patent [19]
Park et al.

[11] Patent Number: 6,146,935
[45] Date of Patent: Nov. 14, 2000

[54] METHOD FOR FORMING CAPACITOR OF SEMICONDUCTOR DEVICE USING PRE-BAKE

[75] Inventors: Hong-bae Park, Seoul; Cha-Young Yoo, Kyungki-do, both of Rep. of Korea

[73] Assignee: Samsung Electronics, Co., Ltd., Suwon, Rep. of Korea

[21] Appl. No.: 09/148,172

[22] Filed: Sep. 4, 1998

[30] Foreign Application Priority Data

Sep. 8, 1997 [KR] Rep. of Korea ................. 97-46187

[51] Int. Cl.[7] .................. H01L 21/8242; H01L 21/00; H01L 21/8234; H01L 21/336
[52] U.S. Cl. .................. 438/238; 438/3; 438/238; 438/257
[58] Field of Search .................. 438/238, 239, 438/329, 362, 398, 575, 580, 582, 603, 604, 240, 3, 257; 257/295, 306

[56] References Cited

U.S. PATENT DOCUMENTS

| | | | |
|---|---|---|---|
| 5,155,658 | 10/1992 | Inam et al. ............................. | 365/145 |
| 5,168,420 | 12/1992 | Ramesh et al. ......................... | 505/170 |
| 5,270,298 | 12/1993 | Ramesh .................................. | 505/238 |
| 5,519,566 | 5/1996 | Perino et al. ........................... | 361/321.4 |
| 5,648,114 | 7/1997 | De Araujo et al. .................... | 427/126.3 |
| 5,811,181 | 9/1998 | Kijima et al. .......................... | 428/328 |
| 5,976,705 | 11/1999 | Koiwa et al. ........................... | 428/469 |
| 5,986,301 | 11/1999 | Fukushima et al. ................... | 257/306 |
| 5,990,507 | 11/1999 | Mochizuki et al. .................... | 257/295 |
| 6,051,858 | 4/2000 | Uchida et al. .......................... | 257/295 |
| 6,066,581 | 4/2000 | Chivukula et al. ..................... | 501/12 |

*Primary Examiner*—Brian Dutton
*Assistant Examiner*—Brook Kebede
*Attorney, Agent, or Firm*—Marger Johnson & McCollom, P.C.

[57] ABSTRACT

A method for forming a capacitor of a semiconductor device. A lower electrode is prebaked before a dielectric layer is formed on the lower electrode. As a result, moisture or contaminants are removed from the lower electrode, increasing adhesion between the lower electrode and the dielectric layer formed on the lower electrode, thereby preventing the dielectric layer from being lifted and cracked due to inferior coating properties.

9 Claims, 3 Drawing Sheets

METHOD FOR FORMING CAPACITOR OF SEMICONDUCTOR DEVICE USING PRE-BAKE

BACKGROUND OF THE INVENTION

1. Field of the Invention

The present invention relates to a method for forming a capacitor of a semiconductor device, and more particularly, to a method for forming a capacitor capable of improving polarization characteristics of a ferroelectric film.

2. Description of the Related Art

Capacitance of a capacitor is proportional to the capacitor electrode area and a dielectric constant of a dielectric material inserted between the electrodes, and inversely proportional to the thickness of the dielectric material. As the integration of semiconductor increases, the capacitor electrode area is decreased, thereby lowering the capacitance of the capacitor. Thus, in order to maintain required capacitance for the capacitor, a conventional method for using a dielectric film having a high dielectric constant, e.g., PZT (Pb(Zr,Ti)O$_3$) film has been suggested.

Hereinafter, a conventional method for forming a capacitor of a semiconductor device, using PZT as a dielectric film, will be described with reference to the appended drawings.

Referring to FIG. 1, after defining a semiconductor substrate 22 into an active region and a field region, a field oxide film 24 is formed in the field region. Then, a gate electrode 26 is formed in the active region. Then, a source region (not shown) and a drain region (not shown) are formed in the semiconductor substrate around the gate electrode 26, to complete a transistor. Then, an inter-layer dielectric layer (28), an adhesion layer 30, a lower electrode 32 and a ferroelectric film 34 are formed in sequence on the entire surface of the resultant structure. The lower electrode 32 is electrically connected to the semiconductor substrate 22 via a contact hole (not shown). Here, the ferroelectric film 34 is formed of PZT by a sol-gel method. Then, an upper electrode (35) is formed on the ferroelectric film 34 and then patterned in cell units.

As described above, in the conventional method for forming the capacitor, the PZT layer is formed by the sol-gel method and is deposited on the lower electrode in a spin-coating manner. Thus, if the surface of a lower electrode on which the PZT layer is to be deposited is rough, the thickness of the PZT layer varies as a result of the uneven surface of the lower electrode. Further, morphology of the PZT layer is locally changed during a high-temperature heating process performed for crystallizing the PZT layer after deposition. As a result, the distribution of remaining polarization of the PZT layer is partially changed and the polarization characteristics of the PZT layer become non-uniform.

Also, if the sol-gel method is used, coating of the PZT layer is inferior along the border of the semiconductor substrate. This is caused by a weak adhesion between the lower electrode and the PZT layer. If the above phenomenon is severe, the PZT layer may not be deposited within a 3–4 cm margin of the lower electrode. If there is an inferior coating in the PZT layer, a crack 40 occurs at the border of the PZT layer 38 as shown in FIG. 2. As a result, impurities can contaminate the wafer 36 in a subsequent process.

SUMMARY OF THE INVENTION

To solve the above problems, it is an object of the present invention to form a capacitor of a semiconductor device, with a ferroelectric film of uniform thickness over the entire surface of a lower electrode, so that remaining polarization characteristics of the ferroelectric film are uniform and formation of cracks on the ferroelectric film is prevented.

The present invention is a method for forming a capacitor of a semiconductor device having a dielectric film between an upper electrode and a lower electrode. The dielectric film is formed on the lower electrode after the lower electrode is prebaked to remove moisture or contaminants from the surface of the lower electrode.

To remove the moisture or contaminants, the lower electrode is prebaked at a temperature range of 200–300° C. for a predetermined time. Preferably, the prebaking is performed at about 300° C. for 30 seconds or so.

The dielectric film is a ferroelectric film having a perovskite crystalline structure containing lead (Pb) or barium (Ba) or having a bismuth (Bi) layered structure.

In the method for forming a capacitor according to the present invention, after forming the lower electrode, the lower electrode is baked before the dielectric (e.g. ferroelectric) film is formed thereon. As a result, moisture or contaminants are removed from the surface of the lower electrode, thereby increasing adhesion between the lower electrode and the ferroelectric film, e.g., PZT layer, formed on the lower electrode. As discussed above, by forming the PZT layer on the previously baked lower electrode, lifting of the PZT layer and partial inferiority in morphology of the PZT layer are both prevented, thereby resulting in the PZT layer having a uniform thickness and a uniform distribution of remaining polarization. In addition, inferior coating of the PZT layer at the border of the lower electrode can be prevented.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENTS

Figure 1:
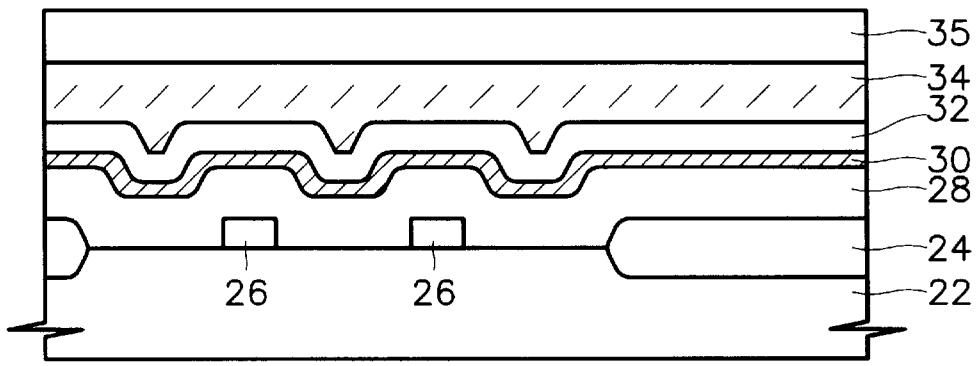
FIG. 1 is a sectional view illustrating a conventional method for forming a capacitor of a semiconductor device.
Figure 2:
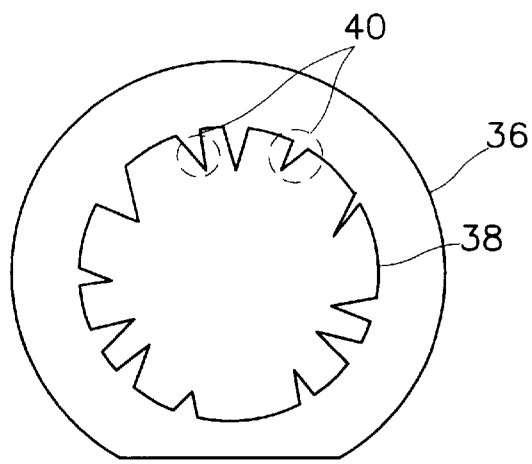
FIG. 2 is a plan view showing a problem of the conventional method.
Figure 3:
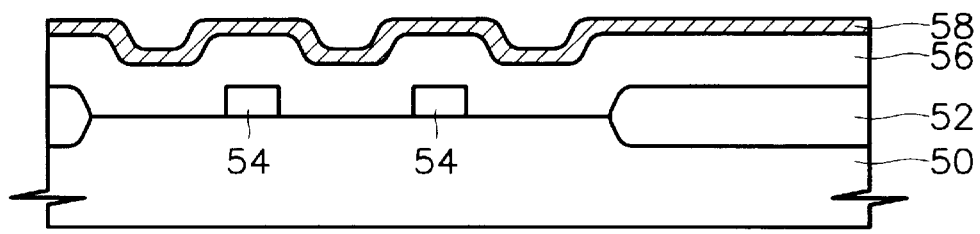
FIGS. 3 through 5 are sectional views illustrating a method for forming a capacitor of a semiconductor device according to a preferred embodiment of the present invention.

Referring to FIG. 3, a semiconductor substrate 50 is defined having an active region and a field region. A field oxide layer 52 is then formed in the field region. The field oxide layer 52 is formed by the LOCOS (LOCal Oxidation of Silicon) method. The field oxide layer 52 may alternatively be formed by a trench method. A gate electrode 54 is formed in the active region. A metal silicide layer (not shown), e.g., tungsten silicide layer, may be further formed on the gate electrode 54. Then, an interlayer dielectric (ILD)

film 56 is formed on the entire surface of the resultant structure to a predetermined thickness. The ILD film 56 is formed of a borophosphosilicate glass (BPSG) layer. Subsequently, an adhesion layer 58 is formed on the entire surface of the ILD film 56. The adhesion layer 58 is formed of a transition metal layer made of titanium or oxides thereof, e.g., titanium oxide ($TiO_2$), alumina ($Al_2O_3$) or iridium oxide ($IrO_2$). The adhesion layer 58 increases adhesion between the ILD film 56 and a lower electrode to be formed subsequently. A contact hole (not shown) for exposing the active region of the semiconductor substrate 50 is previously formed in the ILD film 56. Thus, the adhesion layer 58 is formed over the entire surface of the ILD film 56 and the active regions exposed via the contact hole.

Figure 4:
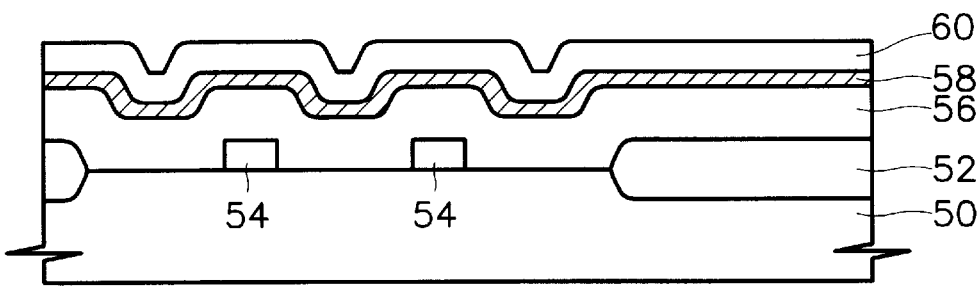

FIG. 4 illustrates the step of forming a lower electrode 60. In detail, the lower electrode 60 is formed over the entire surface of the adhesion layer 58 to a predetermined thickness. When the lower electrode 60 is patterned in cell units, the surface area of the lower electrode of capacitor is determined by the thickness of the lower electrode since a cell interval is predetermined. Thus, when forming the lower electrode 60, such points should be considered in determining the appropriate thickness of the lower electrode 60. The lower electrode 60 may be formed of one noble metal selected from the group consisting of platinum (Pt), iridium (Ir) and ruthenium (Ru). Pt is preferable considering the characteristics of a dielectric film to be formed.

Before the dielectric film 64 is formed on the lower electrode 60, the electrode is heat-treated. By doing so, the dielectric film 64 is formed to a uniform thickness and polarization distribution is improved. More specifically, the lower electrode 60 is prebaked in a predetermined range of temperature for a predetermined duration. That is, the prebaking is performed at about 300° C. for about 30 seconds in order to remove moisture or contaminants from the surface of the lower electrode 60. However, the temperature for prebaking may be 200° C. or more, preferably 200–300° C. within a range capable of removing moisture or contaminants from the surface of the lower electrode 60. Accordingly, the duration for the prebaking may be longer or shorter. If the noble metals disclosed in the present application are baked at temperatures above 500° C., serious problems such as hillocks may be caused. Here, the duration for the prebaking is inversely proportional to the temperature. That is, the higher prebaking temperature, the shorter prebaking time, and vice versa. Thus, the prebaking time is longer than 30 seconds if the prebaking temperature is lower than 300° C., and is shorter than 30 seconds at prebaking temperature of 300° C. or more. The prebaking may be performed for about one minute.

Figure 5:
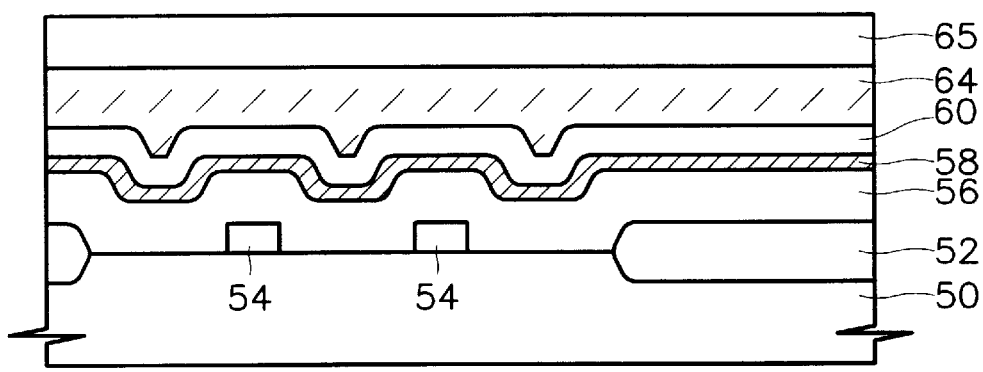

FIG. 5 illustrates the step of forming a dielectric film 64. In detail, the dielectric film 64 is formed on the lower electrode 60. The dielectric film 64 is formed of a ferroelectric film having a perovskite crystalline structure such as one selected from the group consisting of PZT, PTO ($PbTiO_3$), PLZTO((Pb,La)(ZrTi))$O_3$, BTO($BaTiO_3$) and BSTO((Ba,St)$TiO_3$) layers, or having a bismuth (Bi) layered structure such as an SBTO($SrBi_2Ta_3O_9$) layer.

Preferably, the dielectric film 64 is formed of a PZT layer by a sol-gel method, a chemical vapor deposition (CVD) method, a sputtering method or a pulsed laser deposition (PLD) method.

By prebaking, wetting between the lower electrode 60 and the PZT layer is improved at the portion of the lower electrode 60 having the rough surface. Thus, the number of sites for forming PZT nuclei is increased on the lower electrode 60, thereby increasing the adhesion between the PZT layer and the lower electrode 60. This increase in the adhesion occurs over the whole area, so that lifting of the PZT layer is prevented and the PZT layer having a uniform thickness is formed on the lower electrode 60. An upper electrode 65 is formed on the dielectric film 64.

Figure 6:
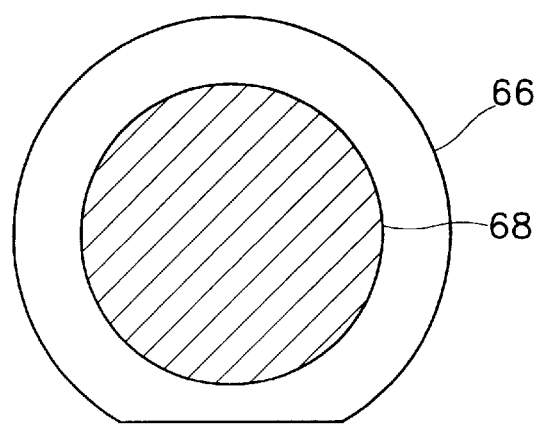
FIG. 6 is a plan view of the resultant structure obtained after forming a dielectric film by the method according to the present invention.

Additionally, the adhesion of the dielectric film over the entire surface of the lower electrode is also improved by the prebaking process, so that the inferior coating of the PZT layer at the border of the lower electrode 60 does not occur. The inferior coating of the PZT layer cause cracking of the PZT layer. However, as shown in FIG. 6, no crack is detected in the resultant structure obtained after forming the dielectric film. In FIG. 6, reference numerals 66 and 68 represent a semiconductor substrate and a PZT layer, respectively. The polarization characteristics of the PZT layer, i.e., distribution of remaining polarization, become uniform over the whole PZT layer by the prebaking.

Figure 7:
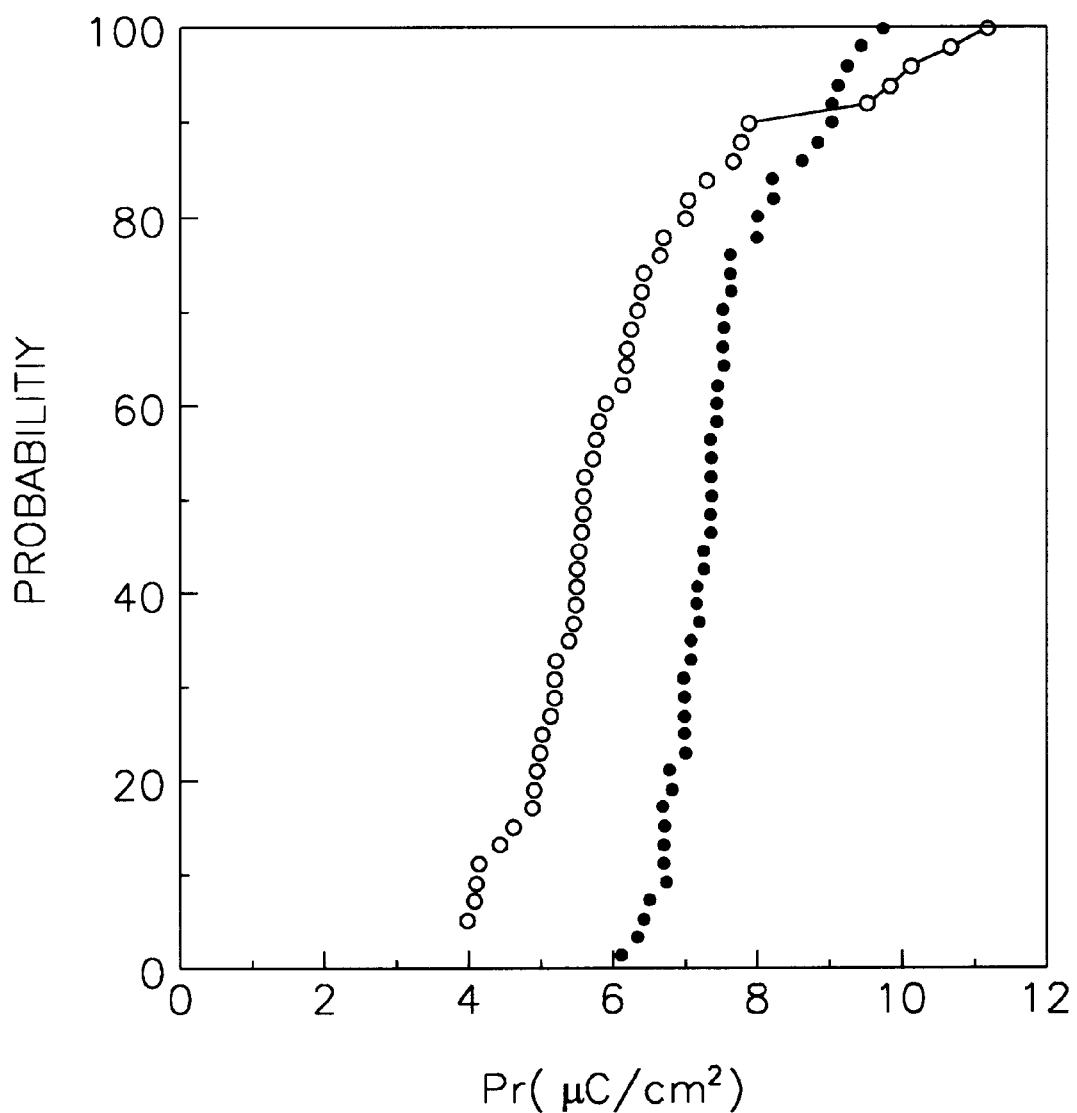
FIG. 7 is a graph comparatively showing polarization characteristics of the dielectric films one of which is formed by the method according to the present invention and the other of which is formed by the conventional method.

FIG. 7 is a graph comparatively showing polarization characteristics of the dielectric films one of which is formed by using the method according to the present invention and the other of which is formed by using the conventional method.

Referring to FIG. 7, the X-axis represents average remaining polarization (Pr) and the Y-axis represents distribution of polarization. In FIG. 7, the graph with blank circles represents a case where the lower electrode is not prebaked, and the graph with filled circles represents a case where the lower electrode is prebaked. As shown in FIG. 7, regardless of whether the prebaking of the lower electrode is performed or not, average remaining polarization (Pr) of the dielectric film formed on the lower electrode does not vary.

However, as shown in FIG. 7, the distribution of polarization is much improved in the case of the prepaked lower electrode than the other case.

According to the capacitor formation method of the present invention, after forming the lower electrode, the lower electrode is prebaked at a temperature range of about 200–300° C. for a predetermined time, e.g., at 300° C. for 30 seconds. As a result, moisture or contaminants are removed from the lower electrode, so that the adhesion between the lower electrode and the dielectric film, e.g., PZT layer, formed on the lower electrode is increased, thereby preventing the PZT layer from being lifted and resulting in the PZT layer having the uniform thickness and distribution of remaining polarization. In addition, the inferior coating property of the PZT layer can be eliminated.

While the present invention has been illustrated and described with reference to a specific embodiment, further modifications and alterations will occur to those skilled in the art within the spirit and scope of this invention.

What is claimed is:

1. A method of forming a capacitor of a semiconductor device, comprising the steps of:

forming a lower electrode of a noble metal layer;

pre-baking the lower electrode at a temperature of about 200–300° C. to remove moisture or contaminants from the surface of the lower electrode, wherein said prebaked is performed for about 30 seconds to about one minute; and after the pre-baking, forming a dielectric film using a sol-gel method on the lower electrode.

2. The method of claim 1, wherein the prebaking is performed at about 300° C. for about 30 seconds.

3. The method of claim 1, wherein the prebalancing is performed for about one minute.

4. The method of claim 1, wherein the noble metal layer is formed of one layer selected from the group consisting of platinum (Pt), iridium (Ir) and ruthenium (Ru).

5. The method of claim 1, wherein the dielectric film is a ferroelectric film having a perovskite crystalline structure containing lead (Pb) or barium (Ba).

6. The method of claim 5, wherein the ferroelectric film having the perovskite crystalline structure containing Pb is selected from the group consisting of $PZT(Pb(Zr,Ti)O_3)$, $PTO(PbTiO_3)$ and $PLZTO((Pb,La)(Zr,Ti)O_3)$.

7. The method of claim 5, wherein the ferroelectric film having the perovskite crystalline structure containing Ba is selected from the group consisting of $BTO(BaTiO_3)$ and $BSTO(Ba,St)TiO_3)$.

8. The method of claim 1, wherein the dielectric film is a ferroelectric film having a bismuth (Bi) layered structure.

9. The method of claim 8, wherein the ferroelectric film having the Bi-layered structure is an $SBTO(SrBi_2Ta_3O_9)$ layer.

* * * * *

UNITED STATES PATENT AND TRADEMARK OFFICE
CERTIFICATE OF CORRECTION

PATENT NO.     : 6,146,935
DATED          : November 14, 2000
INVENTOR(S)    : Park et al.

It is certified that error appears in the above-identified patent and that said Letters Patent is hereby corrected as shown below:

<u>Column 5,</u>
Line 1, "prebalancing" should read -- prebaking --.

Signed and Sealed this

Twenty-eighth Day of January, 2003

JAMES E. ROGAN
*Director of the United States Patent and Trademark Office*